United States Patent [19]
Alcoe et al.

[11] Patent Number: 5,786,635
[45] Date of Patent: Jul. 28, 1998

[54] ELECTRONIC PACKAGE WITH COMPRESSIBLE HEATSINK STRUCTURE

[75] Inventors: David James Alcoe, Vestal; Sanjeev Balwant Sathe, Johnson City, both of N.Y.

[73] Assignee: International Business Machines Corporation, Armonk, N.Y.

[21] Appl. No.: 767,465

[22] Filed: Dec. 16, 1996

[51] Int. Cl.$^6$ .............................. H01L 23/34; H01L 23/10
[52] U.S. Cl. .................... 257/718; 257/719; 257/706; 257/778; 257/779
[58] Field of Search ...................... 257/718, 706, 257/719, 723, 726, 727, 675, 796, 778, 714, 722, 783, 779; 361/676, 704, 709, 688

[56] References Cited

U.S. PATENT DOCUMENTS

| | | | |
|---|---|---|---|
| 4,034,468 | 7/1977 | Koopman | 257/714 |
| 4,254,431 | 3/1981 | Babuka et al. | 257/713 |
| 4,770,242 | 9/1988 | Daikoku et al. | 257/713 |
| 4,825,284 | 4/1989 | Soga et al. | 257/717 |
| 4,993,482 | 2/1991 | Dolbear et al. | 361/704 |
| 5,088,007 | 2/1992 | Missele | 361/704 |
| 5,444,300 | 8/1995 | Sato et al. | 257/706 |
| 5,474,458 | 12/1995 | Vafi et al. | 439/99 |

FOREIGN PATENT DOCUMENTS 377355  4/1991  Japan.

OTHER PUBLICATIONS

"Encapsulation Schemes For C4–Bonded Tab Packages", pp. 205–207, IBM TDB.
Research Disclosure, .A Thermally Enhanced Multichip Thin–Film Module., Aug., 1992, No. 340.

*Primary Examiner*—Mahshid D. Saadat
*Assistant Examiner*—Jhihan B Clark
*Attorney, Agent, or Firm*—Lawrence R. Fraley

[57] ABSTRACT

An electronic package wherein an electronic device (e.g., chip) on a circuitized substrate of the package is thermally coupled to a heatsink in a separable manner using a plurality of compressible, thermally conductive members (e.g., solder balls). These members are compressed and permanently deformed as part of the thermal coupling.

27 Claims, 8 Drawing Sheets

ELECTRONIC PACKAGE WITH COMPRESSIBLE HEATSINK STRUCTURE

TECHNICAL FIELD

The invention relates to electronic packaging for semiconductor devices and particularly to such packaging wherein heatsinks are utilized as part thereof

BACKGROUND OF THE INVENTION

One of the goals of electronics packaging, in general, is to increase the capability of semiconductor devices so as to offer more speed, and programming features, while providing products having smaller, lighter physical sizes. For a given semiconductor technology, such as CMOS or gallium arsenide, this trend leads to higher power dissipation and also to higher heat fluxes. Reliability of semiconductor devices and electronics packaging in general is coupled to operational temperatures, with lower temperatures promoting increased reliability. Therefore, in order to achieve greater operational capability from a semiconductor device without sacrificing reliability thereof, achieving better thermal performance is essential. This trend has been observed since the inception of semiconductor devices in the industry, and is expected to continue for the foreseeable future.

Various methods for improving thermal dissipation of an electronic package have been introduced to accomplish this objective, examples being defined and illustrated in detail in the following U.S. Letters Patents and other pertinent documents:

| | |
|---|---|
| 4,034,468-Koopman | 4,993,482-Dolbear et al |
| 4,254,431-Babuka et al | 5,088,007-Missele |
| 4,825,284-Soga et al | 5,444,300-Miyauchi |
| Jap. Pub. App. 3-77355(A)-Omura | Research Disclosure 340110 (8/92, No. 340) |

U.S. Pat. Nos. 4,034,468 and 4,254,431 are assigned to the same assignee as the present invention.

Typically, electronics packages utilize a semiconductor device or devices. Such devices, also known as chips or die, generate heat during operation. The rate of heat generated is known as the power of the chip and, for a given semiconductor technology, is proportional to the speed and complexity of the chip.

Providing a thermally conductive path from the chip outward is one of the major challenges to electronics packaging technology. A thermal path must be provided which possesses as low a thermal resistance as possible, while satisfying stringent economic factors, assembly processing and handling constraints, and environmental considerations. As is known, the chip is electrically coupled to external circuitry of the package, which in turn may form a part of an overall larger structure, e.g., a microprocessor. Maintaining reliable connection in such assemblies is paramount. Further, the chip must be protected from damage, debris, and chemical attack by coating, protecting, overmolding, globtop, encapsulating, or encasing the connected die with methods and materials well-known in the industry. Chips may be packaged in such a manner that the chip assembly may be subsequently attached to a circuitized substrate (a printed circuit board or a flexible circuit) which forms part of the aforementioned structure. Chips or electronic devices may also be electrically attached to a circuitized substrate using the well-known method of direct chip attach, the chip subsequently being encapsulated, encased, or otherwise protected with a quantity of protective material. Thus, the electronic device which dissipates power is electrically connected to a circuitized substrate by either direct attach or is connected as a packaged device.

In either case, heat must be dissipated from the device without interfering with the electrical connection to the circuitized substrate. It is known that some amount of heat can be removed from the device through the electrical connections and into the circuitized substrate. However, this heat must then be removed from the circuitized substrate and this arrangement may not provide the most thermally efficient path. It is well known that a thermally efficient path is that from the device directly to a nearby structure commonly known as a heatsink and subsequently to the external atmosphere surrounding the heatsink. Various heatsink designs (such as heatsink fin size, shape and spacings) and materials (e.g., aluminum) for optimal performance thereof are known in the art; however, attachment of the heatsink to the device often leaves much to be desired in a thermal sense.

Typically, heatsinks are adhesively bonded directly to the face of a semiconductor device. This method of attachment utilizes a thermally efficiently adhesive, typically a thermosetting epoxy, provided in a thin layer. The heatsink is typically attached to the device after the device has been electrically connected to the circuitized substrate, so that the heatsink does not interfere with that connection process (typically solder wave or solder reflow processes).

One key limitation of this method of attachment is that the thermal adhesive is not removable once it has set. Thus, the entire device must be removed from the circuit card after the heatsink is applied because the heatsink alone may not be removed. If component rework, nearby device changes, or other factors requiring specific thermal processing which cannot tolerate a heatsink present exist, the entire device must be scrapped, which is obviously economically undesirable.

In order to avoid this limitation, a separable connection between the device and the heatsink is desired. In the art, it is common and known to simply press a flat heatsink base onto a flat component face and hold it there with screws, springs, or other retention hardware which allows the heatsink to be removed as needed. However, in practice, this "dry interface" is thermally inefficient. Because of unavoidable tolerances in manufacture of both devices and heatsinks, neither are ever perfectly flat. Thus, the dry interface will have gaps between the device and heatsink surface, such gaps greatly reducing thermal transfer efficiency.

To improve the thermal transfer efficiency, it is also known to include a quantity of thermal-transfer enhancing material such as a thermal grease or conformable thermally conductive material. With thermal grease (one example being alumina-filled silicon grease), containment of the grease in the interface area is a design and manufacturing issue, as leakage can contaminate the circuit board and promote drying and loss of thermal efficiency of the grease interface. Use of thermally conductive conformable material, such as an alumina or aluminum-nitride filled silicon elastomer, is known, but this material has limited thermal efficiency (compared to a solid metal such as solder) and limited ability to fill gaps and conform to the heatsink and device faces without excessive pressure being applied. It is also noted that relatively large research and development expenses are involved in proper grease development and containment.

A further consideration is that with temperature change, an electronic device may change size in several ways. The device may simply expand, in which case whatever shape it started with remains with uniform dimensional change. It may change dimension in a non-uniform manner, e.g., warp, in which case the interface between the heatsink and the device may change dimensions in a complicated manner. These changes may be small or large, and the interface must be able to provide thermal contact successfully despite these "gap changes". Since typical operation of an electronic device involves use at high temperature for an extended period of time, an interface which conforms to the high-temperature interface configuration will successfully allow cooling of the component during use.

It is believed, therefore, that a heatsink interface which assures a "dry", separable (e.g., no grease or material residue cleaning required after separation, and no grease containment issues), thermal connection which is conformable (to accommodate variations in flatness of heatsink and/or device face), is convenient to assemble and apply to existing electronic devices and heatsinks, is of relatively low-cost, and provides relatively low thermal resistance would constitute a significant advancement in the art.

SUMMARY OF THE INVENTION

It is, therefore, a primary object of the present invention to enhance the art of cooling of electronic packages.

It is a more particular object of the invention to provide an interface device to thermally couple an electronic device to a heatsink as part of such an electronic package.

It is another object of the invention to provide such an interface device which thermally connects an electronic device to a heatsink in a separable manner.

It is yet another object of the invention to provide such an interface device which is relatively inexpensive, capable of being used with existing electronic packages and heatsinks, and is relatively simple to assemble.

It is another object of the invention to provide an electronic package utilizing such an interface device.

It is yet another object of the invention to provide an electronic package assembly utilizing such an electronic package having such an interface device as part thereof In accordance with one embodiment of the invention, there is provided an electronic package assembly comprising a circuitized substrate having a plurality of conductors on a first surface thereof, an electronic device positioned on the circuitized substrate and electrically coupled to the plurality of conductors, a heatsink thermally coupled to the electronic device, a plurality of compressible, thermally conductive members positioned between the electronic device and the heatsink and thermally connected thereto in a separate manner, and means for providing compressive force between the heatsink and the electronic device and onto the compressible, thermally conductive members. Selected ones of the plurality of compressible, thermally conductive members are compressed and permanently deformed as a result of the compressive force to provide a separable connection between the heatsink and the electronic device.

In accordance with another embodiment of the invention, there is provided an electronic package comprising an electronic device, a heatsink thermally coupled to the electronic device, a plurality of compressible, thermally conductive members positioned between the electronic device and the heatsink and thermally connected thereto in a separable manner, and means for providing compressive force between the heatsink and the electronic device and, onto the compressible, thermally conductive members. Selected ones of the plurality of compressible, thermally conductive members are compressed and permanently deformed as a result of the compressive force to provide a separable connection between the heatsink and the electronic device.

In accordance with another embodiment of the invention there is provided a method of making an electronic package assembly comprising the steps of providing a circuitized substrate having a plurality of conductors on a first surface thereof, positioning an electronic device on the circuitized substrate and electrically coupling the device to the plurality of conductors, thermally coupling a heatsink to the electronic device in a separable manner, positioning a plurality of compressible, thermally conductive members substantially between the electronic device and the heatsink to form a thermal connection therebetween, and providing compressive force between the heatsink and the electronic device and onto the compressible, thermally conductive members so as to compress and permanently deform the compressible, thermally conductive members to provide a separable connection between the heatsink and the electronic device to thereby define an electronic package assembly.

In accordance with another embodiment of the invention there is provided a method of making an electronic package comprising the steps of providing an electronic device, thermally coupling a heatsink to the electronic device in a separable manner, positioning a plurality of compressible, thermally conductive members substantially between the electronic device and the heatsink to form a thermal connection therebetween, and providing compressive force between the heatsink and the electronic device and onto the compressible, thermally conductive members so as to compress and permanently deform the compressible, thermally conductive members to provide a separable connection between the heatsink and the electronic device to thereby define an electronic package.

According to yet another embodiment of the invention, there is provided a method of making a thermally conductive structure which comprises the steps of providing a flexible member having first and second opposing sides, providing a plurality of openings within the flexible member extending between the first and second sides of the flexible member, positioning a first plurality of compressible, thermally conductive members on the first side of the flexible member such that selected ones of the compressible, thermally conductive members align with respective ones of the openings, and positioning a second plurality of compressible, thermally conductive members on the second side of the flexible member such that selected ones of the second plurality of the compressible, thermally conductive members align with respective ones of the openings substantially directly opposite the selected ones of the first plurality of compressible, thermally conductive members and are in direct physical contact therewith, the first and second pluralities of compressible, thermally conductive members being thermally connected.

According to another embodiment of the invention, a method of making a thermally conductive structure is defined which comprises the steps of providing a flexible member having first and second opposing sides, providing at least one layer of mask material, the layer of mask material substantially adhering to the first side of the flexible member, providing a plurality of apertures in the layer of mask material and positioning a first plurality of compressible, thermally conductive members on the first side of the flexible member within respective ones of the apertures of the layer of mask material.

In accordance with still another embodiment of the invention, there is provided a method of making a thermally conductive structure which comprises the steps of providing a substantially rigid heatsink having at least one surface, providing at least one layer of mask material, the layer of mask material substantially adhered to the surface of the heatsink providing a plurality of apertures in the layer of mask material and positioning a plurality of compressible, thermally conductive members on the surface of the heatsink such that selected ones of the compressible, thermally conductive members are positioned within respective ones of the apertures in the layer of mask material.

According to a further embodiment, there is defined a method of making a thermally conductive structure comprising the steps of providing a member having at least one surface, positioning a layer of adhesive material on the surface of the member, and positioning a plurality of compressible, thermally conductive members on the layer of the adhesive material to thereby secure the plurality of compressible, thermally conductive members to the member.

In accordance with a still further embodiment of the invention, a method of making a thermally conductive structure is defined which includes the steps of providing a plurality of compressible, thermally conductive members, providing a quantity of adhesive material, the adhesive material substantially adhered to at least one preselected portion of each of the compressible, thermally conductive members, providing a member having at least one surface, and positioning the plurality of compressible, thermally conductive members having the adhesive material adhered thereto on the surface of the member such that the adhesive material secures the plurality of compressible, thermally conductive members to the surface of the member.

BEST MODE FOR CARRYING OUT THE INVENTION

For a better understanding of the present invention, together with other and further objects, advantages and capabilities thereof, reference is made to the following disclosure and appended claims in connection with the above-described drawings. It is understood that like numerals are used to indicate like elements from FIG. To FIG.

Figure 1A:
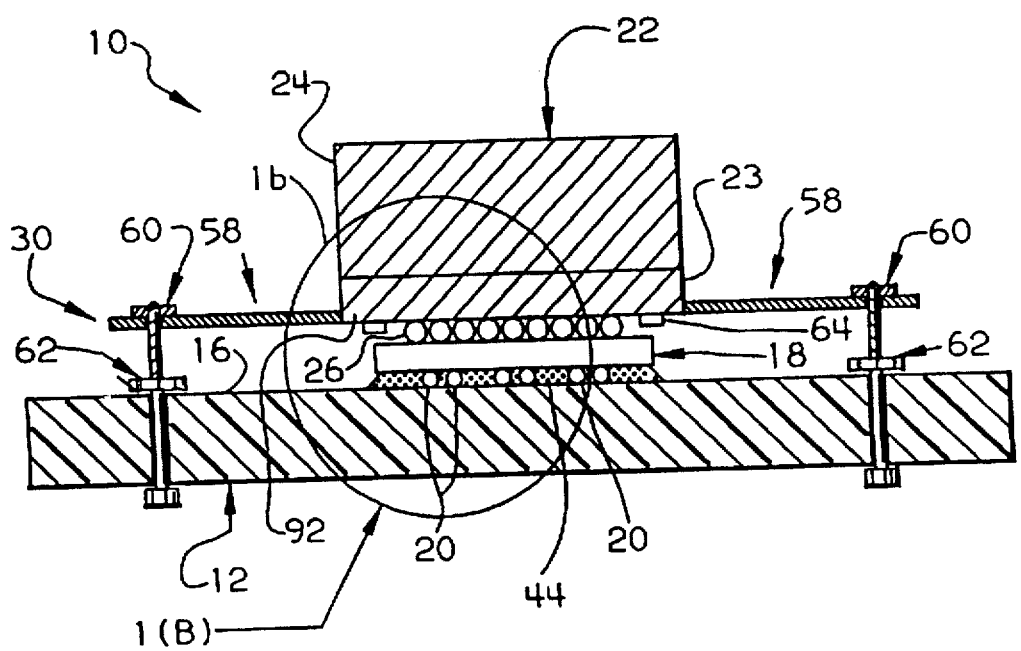
In FIG. 1A, there is illustrated an electronic package assembly in accordance with one embodiment of the invention, this electronic package assembly shown prior to application of compressive force.
Figure 1B:
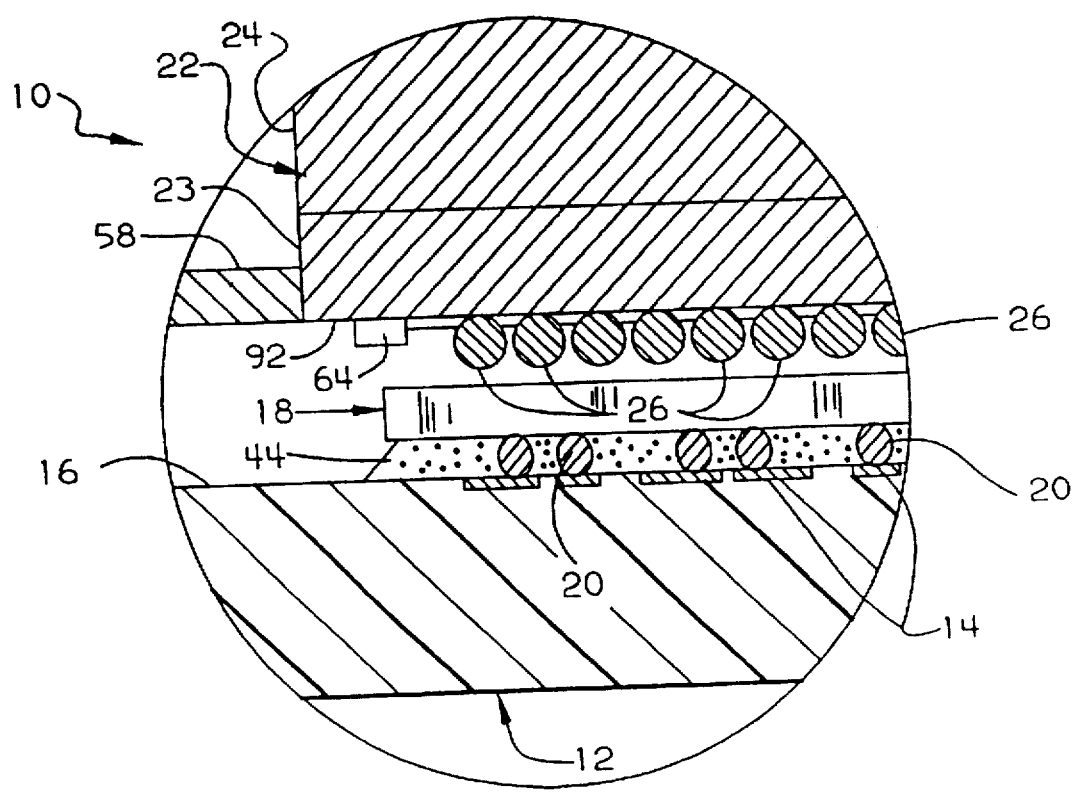
In FIG. 1B, there is illustrated a much enlarged view of a portion of the electronic package assembly shown in FIG. 1A, as indicated by the reference numeral 1B in FIG. 1A.

In FIGS. 1A and 1B, there is shown an electronic package assembly 10 in accordance with one embodiment of the invention. This electronic package assembly 10 includes a circuitized substrate 12 (e.g., a printed circuit board) having a first surface 16 with electrical conductors 14 (e.g., copper pads). Design, manufacture, and use of various embodiments of circuitized substrates such as printed circuit boards, printed wiring boards, flex circuits, etc. are known in the electronics industry and further definition should not be necessary. Also known are various means of electrically coupling an electronic device 18 (e.g., a semiconductor chip) to such a circuitized substrate 12. Examples of such coupling means may include pin-in-hole solder connections, ball grid array (BGA) solder connections, controlled collapse chip connections (C4), leadless chip connections, and surface mount solder attach of the electronic device (if the device includes several projecting leads). According to the invention, a preferred coupling means is to use a plurality of solder balls 20 of the C4 type, each bonded to a respective conductor 14. Similarly, there are many known embodiments of electronic devices 18 which can be electrically coupled to a circuitized substrate 12, including semiconductor chips (as shown), ball grid array (B3GA) modules, leaded components (e.g., dual inline packages (DEIPs)), leadless components, memory devices, transformers, etc. which generate thermal heat during electrical operation and which can be effectively coupled to a heatsink or similar structure using the teachings of the instant invention.

It is known in the electronics art that use of a heatsink can be beneficial in reducing temperature of an electronic device such as chip 18. A primary consideration in the successful implementation of such a heatsink is the effective thermal coupling of the heatsink to the device so that a path of low thermal resistance is created. A path of lower thermal resistance allows a greater rate of heat to be dissipated by the heatsink such that the electronic device can in turn generate a greater rate of heat during operation. There are, of course, other considerations regarding the thermal management of an electronic package assembly, such as airflow over the heatsink, heatsink fin design, internal thermal resistance of the electronic device, thermal path design from the device to the underlying circuitized substrate, etc. As understood, the invention is directly concerned with heat transfer from device to heatsink or similar body. Implementation of the present invention can be accomplished in conjunction with virtually any combination of the above other considerations, assuring a beneficial result for any such combination.

In the drawings, the heatsink is represented by the numeral 22 and is preferably metallic (e.g., copper or aluminum). This heatsink may include a planar base portion 23 having one or more (preferably several) upstanding fins 24 projecting from the base. Such fins are spacedly positioned from one another to facilitate passage of air therethrough. The invention is not limited to usage with such heatsinks as described above, however, in that other heat sinking members (including a liquid cooled plate) are acceptable.

In FIG. 1A, and in greater detail in FIG. 1B, there are illustrated a plurality of compressible thermally conductive members 26, not yet compressed. In the illustrated embodiment, members 26 are directly secured to portions of a surface (face) 92 of heatsink 22. Typical material for these members include tin:lead solder of various ratios, including 63:37 tin:lead solder (a/k/a eutectic solder), 3:97 tin:lead solder and other solders including other materials, such as indium and molybdenum. (That is, in 63:37 tin:lead, the lead comprises about 37 percent by weight of the total solder.) These materials have relatively high thermal conductivities and temperature-dependent rates of creep (higher creep rates occurring at higher temperatures, and lower creep rates at lower temperatures). Eutectic solder is commonly known as "low-melt" solder because it has the lowest solidification temperature of any tin:lead ratio, approximately 183 degrees Celsius (C.). "Low-melt" solder for the purposes of this invention is typically solder with a solidification temperature below about 200 degrees C., characteristic of a solder with lead content from about 30 to 43 percent with the balance tin. "High-melt" solder is typically known as solder with a solidification temperature above about 290 degrees C., characteristic of solder with lead content 80 percent by weight and higher, with the balance tin. Both solders are acceptable for use in the present invention.

Members 26 are spacedly positioned between heatsink 22 and device 18, so that when the heatsink is pressed toward the electronic device, numerous members 26 are in direct thermal contact with both device and heatsink, thereby forming a multiple of several parallel thermal paths. In one example, a total of 400 members 26, in the form of spherical solder balls, may be successfully used for a chip having side dimensions of 18 millimeters (mm). Overall, the thermal resistance between device 18 and heatsink 22 is the parallel sum of these several "small" thermal paths. By employing several hundreds of compressible members 26, it is also possible that every compressible member need not contact the heatsink and/or device, as long as a sufficient number make thermal contact to form a sufficient overall thermal path between the device and heatsink. It has been determined that effective heat transfer can be accomplished by the instant invention through the use of from about one to forty solder balls per square mm of chip area (of the surface directly contacting these balls). Solder balls having diameters from about 0.10 to about 1.5 mm can be successfully utilized in such numbers to assure sound chip heat transference to the above heatsink.

The compressible nature of members 26 is utilized to provide a conforming interface in those situations wherein a substantially non-planar electronic device and/or non-planar heatsink surface face one another. This is accomplished by adjusting several design factors of the invention. In general, a small but sufficient compressive force is applied using means 30, so that members 26 experience creep-inducing stress. Because there may be many hundreds (or thousands) of members 26, and because of gap dimensional tolerances, the number of members actually making initial contact may be quite low. These members thus experience relatively high stress which may deform and creep relatively rapidly. In other words, the interface gap dimensions decrease as these compressible members are compressed. Continuing force application, the reduction of interface gap dimensions eventually results in more and more members 26 making contact. As more members 26 become in contact and carry the compressive load, the stress in the compressible members becomes greatly reduced and the deformation process slows. After a period of time of force application, nearly all the compressible members 26 may come into contact with both members 18 and 22. Additionally, as the compressible members become compressed, the height of each member decreases with a corresponding increase in area of the member contacting both device 18 and heatsink 22. It is again worth mentioning that as this process occurs, the high stress on members 26 is reduced due to increasing contact and member area.

Since creep rate is highly dependent on temperature, the process can be expedited by increasing temperature (e.g., by operation of the device 18 during compression, by externally applied heat (e.g., placing the assembly in an oven or using a hot air flow, etc.)). However, it is not necessary (nor desired) to exceed the melting temperature of the compressible members 26 in order to achieve a conformed interface, as creep readily takes place at temperatures below that of the melting points of these materials. Because of this, there is not sufficient adhesion between the compressible members and the device 18 and/or heatsink such that simple disassembly and removal of the heatsink 22 and compressible members 26 from the electronic device 18 is readily possible. This is a particularly significant feature of the instant invention because it allows access to the electronic device (e.g., for testing, rework, replacement, etc.). It also avoids the possibility of reflowing the solder balls 20 used to connect device 18 to substrate 12. The melting points of these balls 20 are, understandably, greater than such elevated temperatures used in the foregoing compression.

By choosing appropriate materials and dimensions for compressible members 26, the proper number of such members, the correct compressive load and operating temperature, a relatively large amount of gap tolerance can be absorbed by the compressible members of the invention in a relatively short period of time, with a reasonably large number of members making thermal contact for a series of effective thermal paths. In one example, using eutectic solder balls for compressible members (each of a diameter of about 0.80 mm) placed on a 1.27 mm pitch rectangular array of 28 by 29 rows (total of 812 members), effective compression is possible using a total load of only approximately ten to thirty pounds. It is noted that use of numerous compressible members instead of a solid sheet of like material and thickness greatly reduces the compressive load needed to deform the compressible members over that required for like deformation of such a solid sheet.

Figure 2:
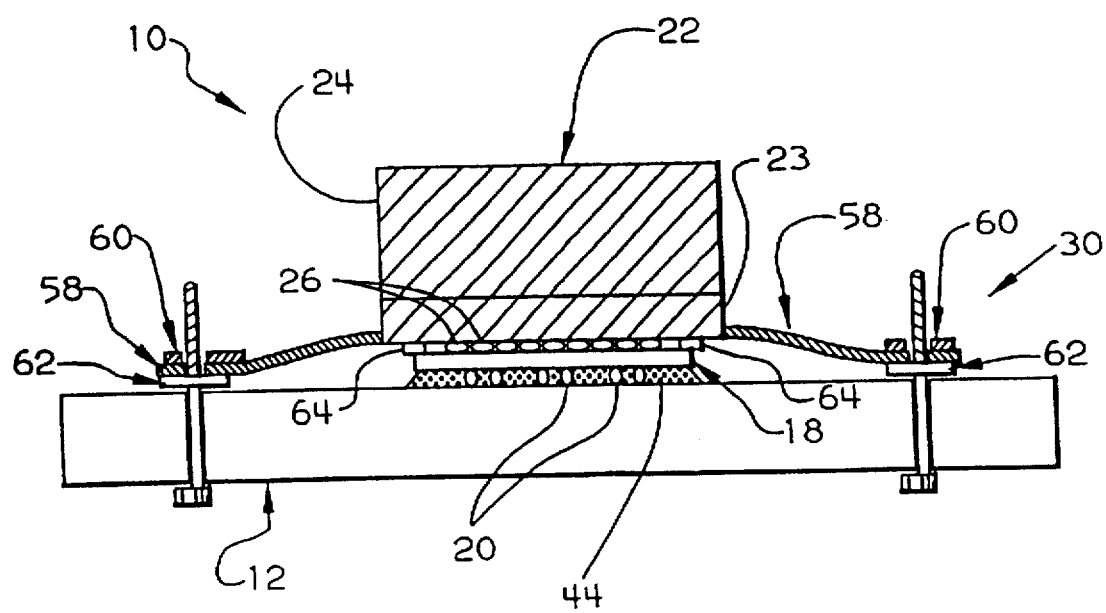
In FIG. 2, there illustrated the electronic package assembly in FIG. 1A after application of compressive force.

As illustrated in FIG. 1A, the means 30 to apply the above compressive force includes a retention spring 58, two spaced fasteners 60, and a pair of studs 62. In FIG. 2, the electronic package assembly is shown after compressive force is applied for a predetermined time period, such that the compressible members have been deformed to the extent allowed by clearance feature 64 (which may simply comprise one or more metal elements affixed (e.g., soldered) to surface 92 of the heatsink). In the example given above, it could take an extensive time period at a relatively low temperature (e.g., 80 degrees C.) to deform the members 26. However, with an elevated temperature of about 100 to 140 degrees C., it would only take relatively few (e.g., 5) minutes for members 26 to deform sufficiently to take up-several mils of coplanarity mismatch. Such time is enough to allow sufficient contact to compressible members to occur to form a good overall thermal path (actually several individual paths) between device 18 and heatsink 22.

In order to avoid compressing and stressing the solder balls 20 between device 18 and substrate 12 as compressive force is applied to members 26, use of an encapsulant material 44 is illustrated in FIGS. 1A, 1B and 2. This encapsulant material 44, which may be a known material such as Hysol 4510, available from Dexter Electronic Materials, Industry, California (Hysol is a registered trademark of Dexter Electronic Materials), is harder than the solder balls 20, and typically carries almost all of the compressive force between the electronic device 18 and circuitized substrate 12, such that this electrical coupling incurs little or no stress. For direct chip attach schemes (where device 18 is a semiconductor chip), utilization of encapsulant material 44 is typically required for other reasons (e.g., to relieve thermal expansion mismatch between chip and printed circuit card) and therefore has synergy with the present invention.

Figure 3:
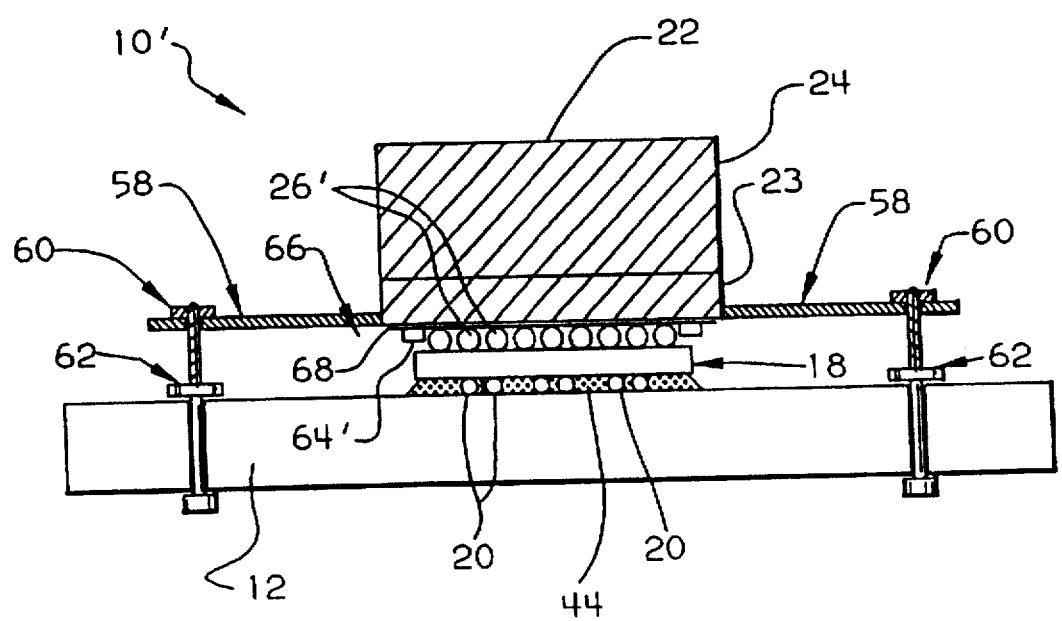
In FIG. 3, there is illustrated an electronic package assembly in accordance with another embodiment of the invention, this electronic package assembly shown with compressible, thermally conductive members secured to a flexible member. This electronic package assembly is shown before the application of compressive force.

In FIG. 3, there is illustrated an electronic package assembly 10' in accordance with another embodiment of the invention. This electronic package assembly is shown with a thermally conductive structure 66 comprised of a plurality of compressible, thermally conductive members 26' secured to a flexible member 68 (see FIG. 4 below). Members 26' are preferably of similar material as members 26 in FIGS. 1A, 1B and 2. The flexible member 68 is shown positioned between heatsink 22 and electronic device 18, before the application of compressive force using a similar means as in FIG. 2. Standoff clearance feature 64' is shown secured to flexible member 68 so that deformation of the compressible members is limited to a predetermined amount.

Figure 4:
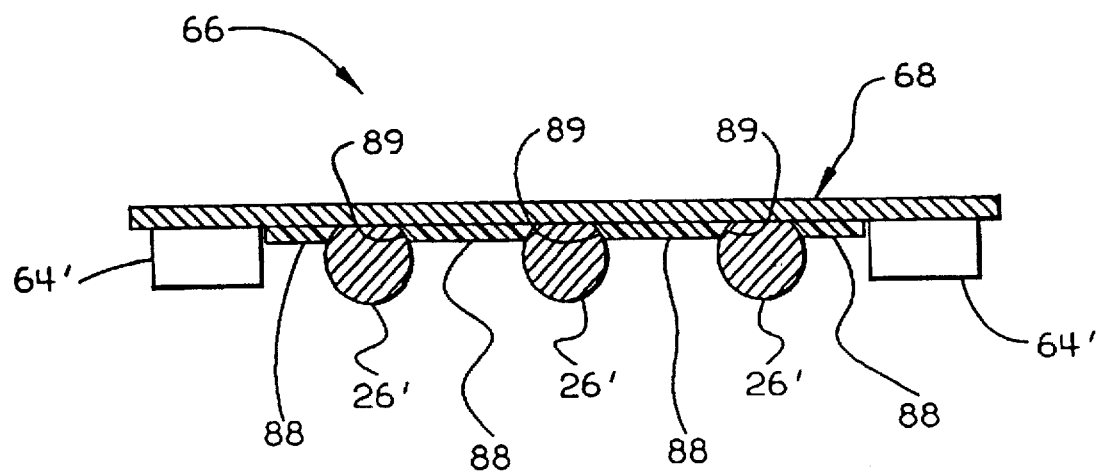
In FIG. 4, there is illustrated a much enlarged view of a thermally conductive structure having a plurality compressible, thermally conductive members secured to a flexible member, in accordance with the embodiment of the invention shown in FIG. 3.

In FIG. 4, there is illustrated an enlarged view of thermally conductive structure 66 including a plurality of compressible, thermally conductive members 26' secured to the flexible member 68 as shown in FIG. 3. (Actually, only three members 26' are shown for better illustration purposes.) For this embodiment, a material for flexible member 68 is preferably annealed (soft) copper foil of 1 mil (0.001) or less thickness, such that good heat conduction and low bending stiffness is assured, in addition to effective bonding to members 26'. Other metal materials, including copper alloy or aluminum alloy foil are also acceptable. Mask material 88 with apertures 89 may be used to define positioning of compressible members 26', but is not required. Additionally, a thermal adhesive may be used to secure compressible members 26' to flexible member 68. One example of such adhesive is RTK 7455, available from AI Technology, Inc., Lawrenceville, N.J. Standoff feature 64' is also illustrated in FIG. 3, so that deformation of the compressible members will be limited to a predefined amount. Feature 64', like feature 64; in FIGS. 1A, 1B and 2, is preferably a metallic member and is bonded to flexible member 68, e.g., also using a suitable adhesive such as EG 7655, also available from AI Technology, Inc. Feature 64' can also be of solder material, particularly one having a greater melting point than those of members 26' and 20. Feature 64' can also be directly secured to a surface of device 18, rather than as depicted herein.

Figure 5:
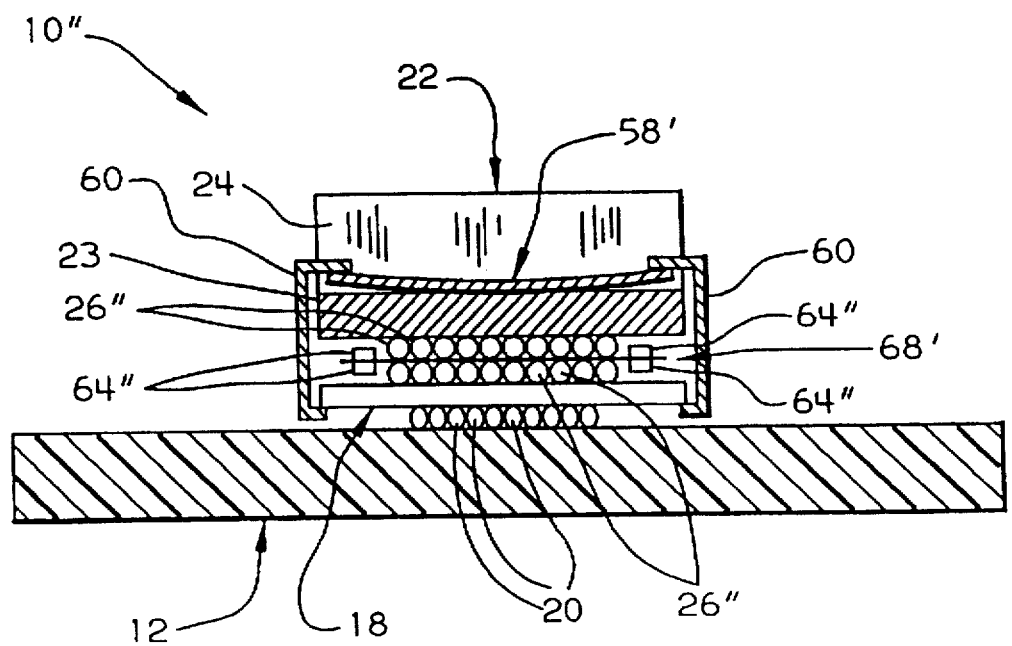
In FIG. 5, there is illustrated an electronic package in accordance with another embodiment of the invention, this electronic package shown with compressible, thermally conductive members secured to a flexible member. The electronic package in FIG. 5 is shown before the application of compressive force, and is depicted attached to a circuitized substrate with a plurality of electrical conductors.

In FIG. 5, there is illustrated an electronic package 10" in accordance with another embodiment of the invention. Package 10" is illustrated as including solder ball members 20 and circuitized substrate 12 similar to those elements in FIGS. 1A, 1B, 2 and 3. This electronic package is also shown with compressible, thermally conductive members 26" secured to a flexible member 68' in accordance with the teachings of FIGS. 6A, 6B, 6C or 6D. The electronic package in FIG. 5 is shown before the application of compressive force, with the compressible members 26" positioned between the electronic device 18 and heatsink 22. Further description of the flexible member and compressible members 26' will be provided hereinbelow with the description of FIGS. 6A, 6B, 6C and 6D.

In FIG. 5, a means for providing compressive force between the heatsink 22 and electronic device 18 includes an elongated retention spring 58' and an external means for forcing spring 58' onto the base 23 of heatsink 22, such as a pair of spring-clips 60. Spring 58' is preferably of the same material as spring 58, while clips 60 may be of stainless steel. It is significant to note that the means illustrated in FIG. 5 for providing compressive force does not result in significant force or stress on electrical coupling members 20 between electronic device 18 and substrate 12 such that encapsulant material (similar to as illustrated in FIG. 3) is not required to relieve such stresses on members 20. Members 20, not having stress thereon, may therefore be solder balls (as shown), solder columns, pin-in-hole members (if device 18 is an electronic module, for example), etc. The compressible members 26" secured to flexible member 68' provide a good thermal path between device 18 and heatsink 22 by readily conforming to the interface gap dimensions therebetween. As explained below, two opposing pluralities of such members 26" are used in this embodiment of the invention.

Figure 6A:
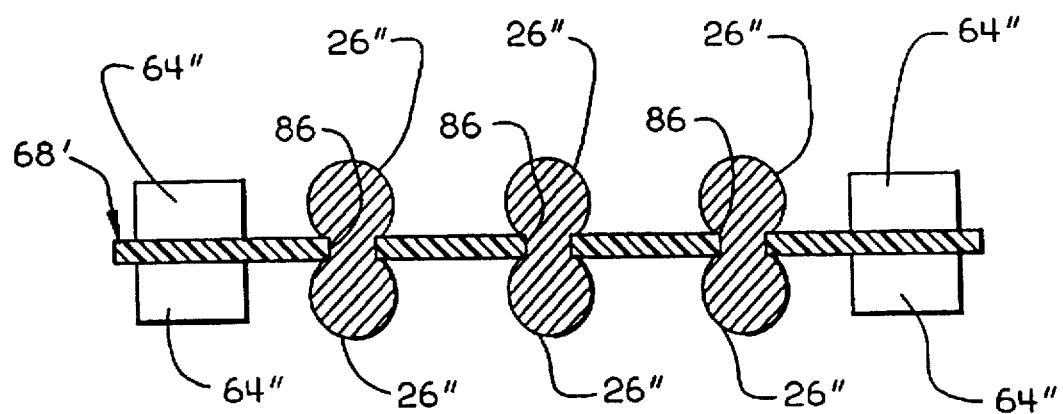
In FIG. 6A, there is illustrated a thermally conductive structure including a plurality of compressible, thermally conductive members secured to a flexible member which may be used with the embodiment of the invention as shown in FIG. 5.

In FIG. 6A, the thermally conductive structure of FIG. 5 is shown including the plurality of compressible, thermally conductive members 26" secured to interim flexible member 68'. Openings 86 are provided, through which members 26", being thermally coupled, may conduct heat. A preferred material for flexible member 68' is a thin (e.g., 0.025 mm thick) sheet of polyimide or similar polymer, non-conductive (electrically) material. Because member 68' is primarily concerned with thermal transfer, it can also be of metallic material, such as copper or aluminum in thin sheet form. Members 26" are of similar material as members 26 above, and are aligned in the illustrated paired orientations and then partly reflowed to bond the respective pairs through an opening 86 in member 68'.

Figure 6B:
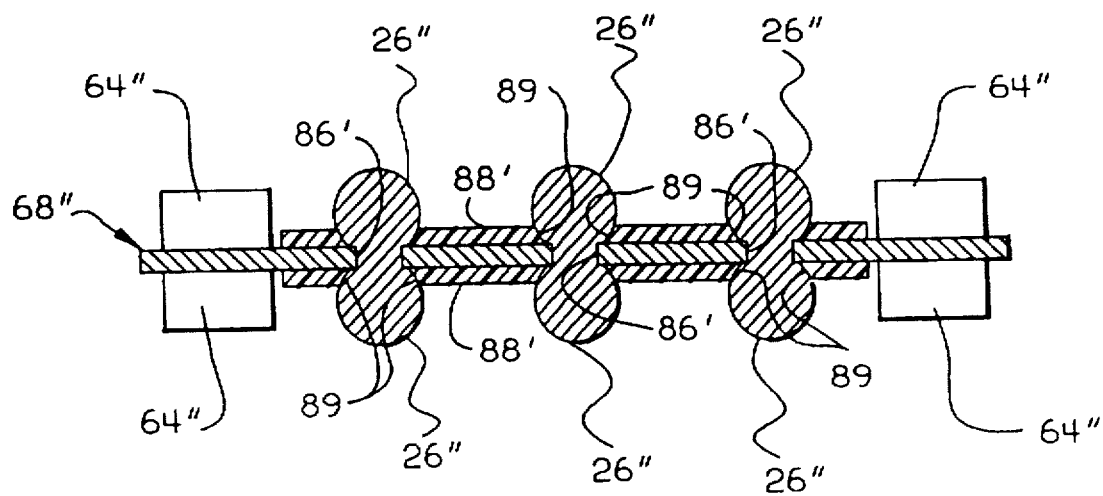
In FIG. 6B there is illustrated a thermally conductive structure including a plurality of compressible, thermally conductive members secured to a flexible member in accordance with another embodiment of the invention.

In FIG. 6B, there is illustrated a plurality of compressible, thermally conductive members 26" secured to a flexible member 68" similarly to the embodiment of the invention in FIG. 6A. Mask material 88' (similar to material 88 in FIG. 4) with apertures 89 therein is shown in conjunction with corresponding openings 86' in flexible member 68". A preferred material for flexible member 68" in this embodiment is a thin sheet of copper. Mask material 88' assists in member 26" positioning on the opposed sides of member 68" across the interim openings.

Figure 6C:
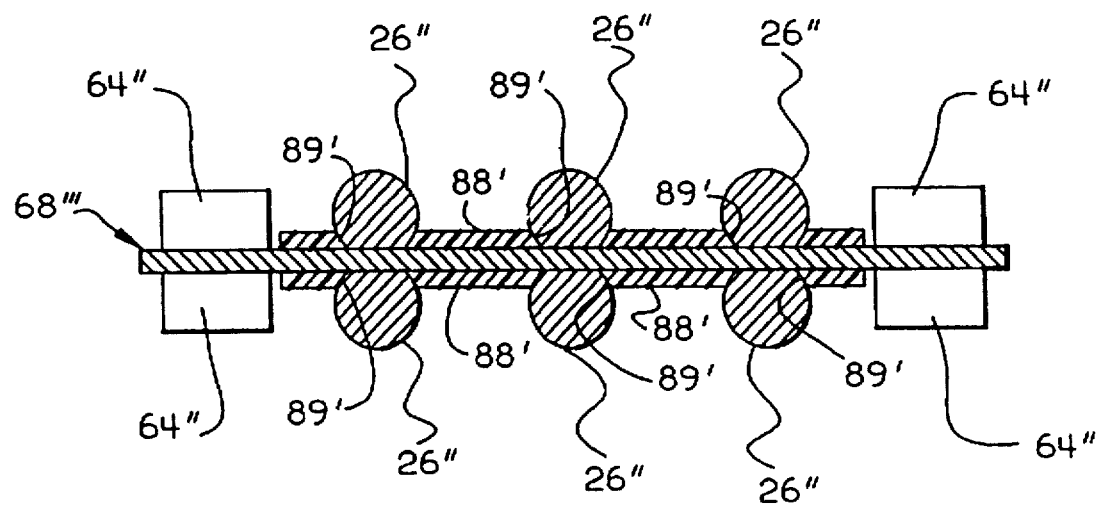
In FIG. 6C, there is illustrated a thermally conductive structure including a plurality of compressible, thermally conductive members secured to a flexible member in accordance with still another embodiment of the invention.

In FIG. 6C, a plurality of compressible, thermally conductive members 26" are secured to an interim flexible member 68'" in accordance with still another embodiment of the invention. In this embodiment, flexible member 68''' does not need to have openings (86'); instead mask 88' has apertures 89' to allow thermal contact between thermally conductive members on opposite of the solid interim flexible member 68'''. Precise alignment of the compressible members 26" on both opposite sides of the solid flexible member 68''' is also assured with the correspondingly aligned pairs of apertures 89' as shown in FIG. 6C. Member 68''' is obviously of sound thermally conductive material, preferred examples being thin sheets of aluminum or copper or alloys thereof.

In all of the embodiments of FIGS. 6A–6D, a preferred material for members 26" is one of the aforedefined solders. Alternatively, different melting point solders are possible for each plurality on its respective side of the interim member. The standoffs 64" are also of similar material (to standoffs 64 and 64') and secured to the interim flexible member in substantially the same way as in either FIGS. 1A–2 or FIG. 3.

Figure 6D:
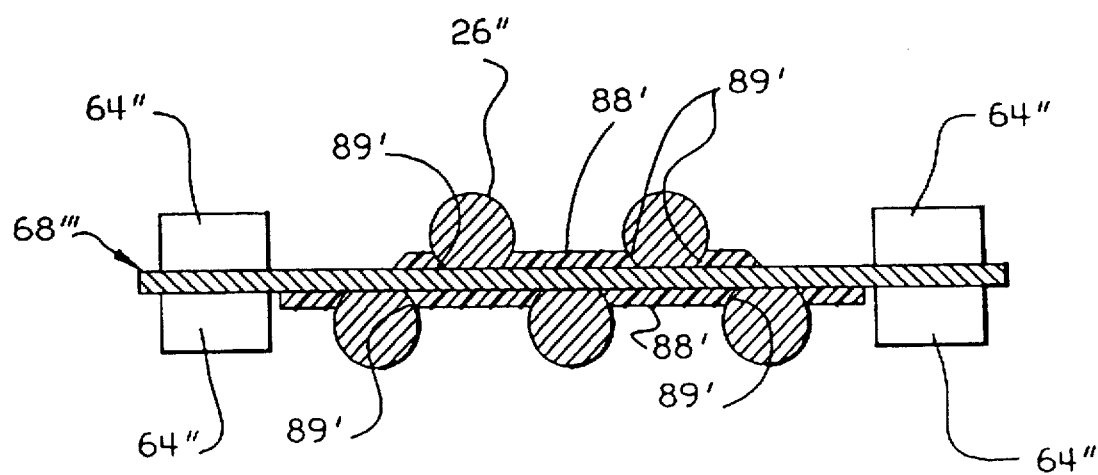
In FIG. 6D, there is illustrated a thermally conductive structure having a plurality of compressible, thermally conductive members secured to a flexible member in accordance with yet another embodiment of the invention.

Other alignment schemes, such as partially misaligned and full out-of-phase alignment (as in FIG. 6D) of the invention's compressible members between opposing sides of the interim flexible member 68''' may be beneficially utilized to enhance thermal contact between the illustrated surfaces of heatsink 22 and electronic device 18. An embodiment of the invention is illustrated in FIG. 6D, in which compressible members 26" are in out-of-phase alignment with opposing members 26" on opposing sides of the solid flexible member 68'''. It is evident that upon compression, the flexible member will act as a spring in conjunction with compression and creep of members 26". Therefore, with a small increase in thermal resistance, very large interface gaps and gaps which significantly change dimensions during use may be readily accommodated. A preferred material for the thin flexible member 68''' in FIG. 6D is a thin sheet of copper acting as an elastic spring in conjunction with compressible members 26". Multiple layers of such an embodiment may be positioned between device 18 and heatsink 22 to provide even further compliance and tolerance accommodation. It is also understood that in FIG. 6D, the number of members 26" on one side of member 68" need not be the same number as those on the opposite side. Such members 26" can even be randomly distributed on the respective opposite sides. A mask material 88' can also be used, including one having apertures 89' therein. Two layers of material 88' are used in FIGS. 6B and 6C.

Figure 7A:
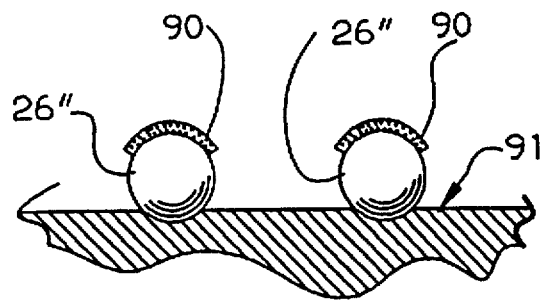
In FIG. 7A and 7B, there is shown one example of a method of positioning the compressible, thermally conductive members of the invention with respect to an external surface; and In FIGS. 8A and 8B, there is shown yet another example of positioning the invention's compressible, thermally conductive members on an external surface.
Figure 7B:
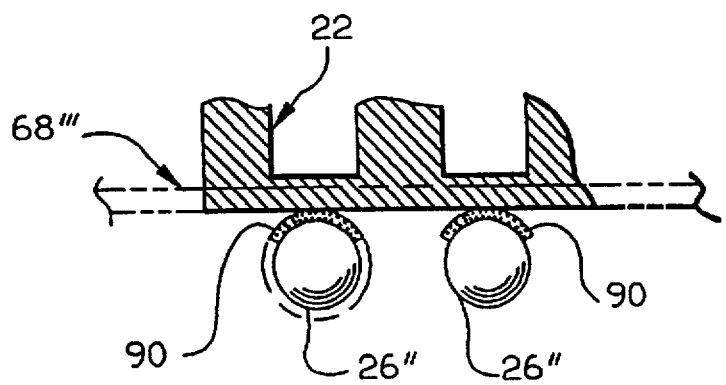
Figure 8A:
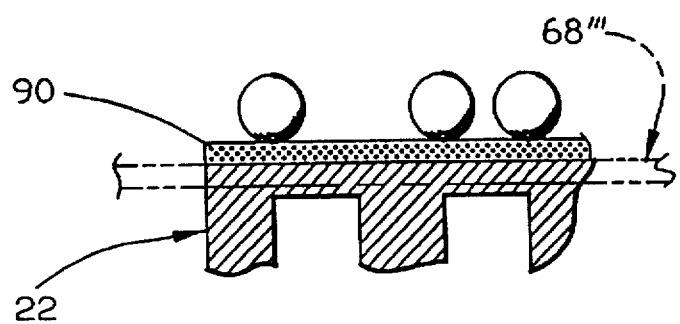
Figure 8B:
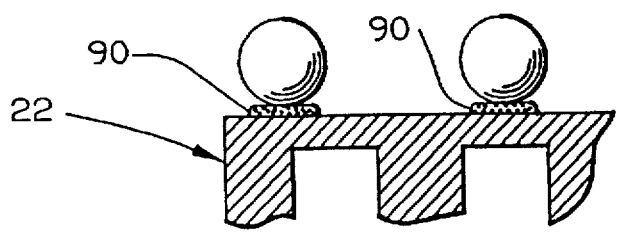

In FIGS. 7A–8B, there are shown various methods for securing a plurality of thermally conductive, compressible members such as solder balls 26" onto a surface (such as that of heatsink 22 or flexible member 68). In the embodiments of FIGS. 4 and 6B–6D, solder paste and/or solder balls 26" (e.g., 0.025 inch diameter eutectic solder balls) can be positioned within apertures 89, while the ambient temperature is raised to about the melting point of the solder, causing the solder to reflow and then wet to the corresponding surface of heatsink 22. These solder members will subsequently adhere to the heatsink after the temperature is reduced to below the solder melting point and the solder cools (solidifies). In FIGS. 7A and 7B, simply coating the solder balls 26" with a thermally conductive adhesive 90 (while the balls are retained in a template 91) and then gently pressing the solder balls with the adhesive thereon onto the heatsink or flexible member is both effective and economical. Pressing of the solder balls serves to displace the adhesive sufficiently to form apertures therein (not shown in FIG. 7B) and thereby assure direct solder ball to heatsink (or flexible member) contact. The preferred adhesive is a soft, thermally conductive adhesive, one example being GE32XX silicone adhesive from General Electric Company, Waterford, N.Y. Alternatively, "dots" of such adhesive may be placed in predetermined positions on the flexible member or heatsink, with the solder balls picked up by adhesion at these points, and gently pressed into place. Uncured solder mask material may serve as an adhesive, or screening thermal adhesive onto the flexible member in a manner resembling a solder mask may also be economically utilized. In FIGS. 8A and 8B, conductive members 26" may be randomly dispersed on a layer of adhesive 90 on the heatsink 22 or flexible member 68" (shown in phantom), and then pressed into direct contact therewith (not shown). Alternatively, "dots" of adhesive 90 can be provided on the respective surfaces (much as described above), the members 26" thereby engaging such material, and pressure again applied to effect direct solder-to-surface contact (not shown).

While there have been shown and described what are at present the preferred embodiments of the invention, it will be obvious to those skilled in the art that various changes and modifications may be made therein without departing from the scope of the invention as defined by the appended claims.

What is claimed is:

1. An electronic package assembly comprising:
   a circuitized substrate having a plurality of conductors on a first surface thereof;
   an electronic device positioned on said circuitized substrate and electrically coupled to said plurality of conductors;
   a heatsink thermally coupled to said electronic device;
   a plurality of compressible, thermally conductive members positioned between said electronic device and said heatsink and thermally connected thereto in a separable manner, said compressible, thermally conductive members comprising a plurality of solder elements; and
   means for providing compressive force between said heatsink and said electronic device and onto said compressible, thermally conductive members, selected ones of said plurality of compressible, thermally conductive members being compressed and permanently deformed to provide a separable connection between said heatsink and said electronic device.

2. The electronic package assembly of claim 1 wherein said circuitized substrate is a printed circuit board.

3. The electronic package assembly of claim 1 wherein said electronic device comprises a semiconductor chip.

4. The electronic package assembly of claim 1 wherein said electronic device comprises a module.

5. The electronic package assembly of claim 1 wherein said solder elements are comprised of low melting point solder.

6. The electronic package assembly of claim 1 wherein said means for providing compressible force comprises at least one retention spring operatively coupled to said circuitized substrate and said heatsink.

7. The electronic package assembly of claim 1 including at least one clearance feature positioned between said heatsink and said electronic device for defining a predetermined spacing between said heatsink and said electronic device, said clearance feature secured to said electronic device.

8. The electronic package assembly of claim 1 including at least one clearance feature positioned between said heatsink and said electronic device for defining a predetermined spacing between said heatsink and said electronic device, said clearance feature secured to or forming part of said heatsink.

9. The electronic package assembly of claim 1 further including a flexible member located between said heatsink and electronic device, said plurality of solder elements of said plurality of compressible, thermally conductive members being secured to said flexible member.

10. The electronic package assembly of claim 3 further including a second plurality of solder elements electrically coupling said chip to said plurality of conductors.

11. The electronic package assembly of claim 10 further including a quantity of encapsulant material substantially supporting said chip above said substrate.

12. The electronic package assembly of claim 10 wherein the melting points of said second plurality of solder elements are greater than the melting points of said plurality of solder elements of said compressible, thermally conductive members.

13. The electronic package assembly of claim 12 wherein said second plurality of solder elements are comprised of 10:90 tin:lead solder, and said plurality of solder elements of said compressible, thermally conductive members are comprised of 63:37 tin:lead solder.

14. The electronic package assembly of claim 6 further including means for fastening said retention spring to said circuitized substrate.

15. The electronic package assembly of claim 14 wherein said means for fastening comprises at least two studs spacedly positioned within said circuitized substrate.

16. The electronic package assembly of claim 9 wherein said flexible member includes a plurality of openings, selected ones of said thermally conductive members being positioned within respective ones of said openings.

17. The electronic package assembly of claim 9 wherein said flexible member includes at least one standoff feature attached thereto or forming part thereof for defining a predetermined spacing between said heatsink and said electronic device.

18. An electronic package comprising:

an electronic device;

a heatsink thermally coupled to said electronic device;

a plurality of compressible, thermally conductive members positioned between said electronic device and said heatsink and thermally connected thereto in a separable manner, said compressible, thermally conductive members comprising a plurality of solder elements;

means for providing compressive force between said heatsink and said electronic device and onto said compressible, thermally conductive members, selected ones of said plurality of compressible, thermally conductive members being compressed and permanently deformed as a result of said compressive force to provide a separable connection between said heatsink and said electronic device.

19. The electronic package of claim 18 wherein said electronic device comprises a semiconductor chip.

20. The electronic package of claim 18 wherein said electronic device comprises a module.

21. The electronic package of claim 18 wherein said solder elements are comprised of low melting point solder.

22. The electronic package of claim 18 wherein said means for providing compressible force comprises at least one retention spring operatively coupled to said electronic device and said heatsink.

23. The electronic package of claim 18 further including at least one clearance feature positioned between said heatsink and said electronic device, said clearance feature secured to or forming part of said heatsink.

24. The electronic package of claim 18 including at least one clearance feature positioned between said heatsink and said electronic device, said clearance feature secured to said electronic device.

25. The electronic package of claim 18 further including a flexible member located between said heatsink and said electronic device, said plurality of said solder elements of said plurality of said compressible, thermally conductive members being secured to said flexible member.

26. The electronic package of claim 25 wherein said flexible member includes a plurality of openings, selected ones of said plurality of solder elements of said compressible, thermally conductive members being positioned within respective ones of said openings.

27. The electronic package of claim 18 wherein said flexible member includes at least one standoff feature attached thereto or forming part thereof.

* * * * *